(12) United States Patent
Satoh

(10) Patent No.: US 10,818,731 B1
(45) Date of Patent: Oct. 27, 2020

(54) THREE-DIMENSIONAL NONVOLATILE MEMORY

(71) Applicant: Avalanche Technology, Inc., Fremont, CA (US)

(72) Inventor: Kimihiro Satoh, Fremont, CA (US)

(73) Assignee: Avalanche Technology, Inc., Fremont, CA (US)

( * ) Notice: Subject to any disclaimer, the term of this patent is extended or adjusted under 35 U.S.C. 154(b) by 0 days.

(21) Appl. No.: 16/446,532

(22) Filed: Jun. 19, 2019

(51) Int. Cl.
| | |
|---|---|
| *H01L 27/24* | (2006.01) |
| *H01L 43/02* | (2006.01) |
| *H01L 45/00* | (2006.01) |
| *G11C 11/16* | (2006.01) |
| *H01L 27/22* | (2006.01) |
| *G11C 13/00* | (2006.01) |
| *H01F 10/32* | (2006.01) |

(52) U.S. Cl.
CPC ......... *H01L 27/249* (2013.01); *G11C 11/161* (2013.01); *G11C 13/0004* (2013.01); *H01F 10/3254* (2013.01); *H01F 10/3286* (2013.01); *H01L 27/224* (2013.01); *H01L 27/2409* (2013.01); *H01L 43/02* (2013.01); *H01L 45/06* (2013.01); *H01L 45/1233* (2013.01); *G11C 13/0007* (2013.01); *G11C 2213/31* (2013.01); *G11C 2213/32* (2013.01); *G11C 2213/71* (2013.01); *G11C 2213/72* (2013.01); *H01L 45/144* (2013.01); *H01L 45/146* (2013.01); *H01L 45/147* (2013.01)

(58) Field of Classification Search
CPC .................................................. H01L 27/0207
See application file for complete search history.

(56) References Cited

U.S. PATENT DOCUMENTS

| | | | | |
|---|---|---|---|---|
| 5,784,636 | A * | 7/1998 | Rupp | G06F 15/7867 712/37 |
| 7,054,219 | B1 | 5/2006 | Petti et al. | |
| 7,177,169 | B2 | 2/2007 | Scheuerlein | |
| 7,286,439 | B2 * | 10/2007 | Fasoli | G11C 8/10 365/185.01 |
| 8,780,651 | B2 | 7/2014 | Yan et al. | |
| 9,647,035 | B2 | 5/2017 | Tran et al. | |
| 2009/0116280 | A1 * | 5/2009 | Parkinson | G11C 13/004 365/163 |
| 2016/0172494 | A1 * | 6/2016 | Liaw | H01L 27/2454 257/329 |

* cited by examiner

*Primary Examiner* — Thao P Le
(74) *Attorney, Agent, or Firm* — Bing K. Yen

(57) ABSTRACT

The present invention is directed to a memory array including one or more memory layers, each of which includes a first plurality of memory cells and a second plurality of memory cells arranged in alternated odd and even columns, respectively; multiple odd horizontal lines with each connected to a respective odd column of the first plurality of memory cells; multiple even horizontal lines with each connected to a respective even column of the second plurality of memory cells; multiple transverse lines with each connected to one of the first plurality of memory cells and a respective one of the second plurality of memory cells disposed adjacent thereto along a row direction; and multiple vertical lines with each connected to a respective one of the multiple transverse lines. The odd horizontal lines collectively form fingers of a first comb structure and the even horizontal lines collectively form fingers of a second comb structure.

20 Claims, 11 Drawing Sheets

THREE-DIMENSIONAL NONVOLATILE MEMORY

BACKGROUND

The present invention relates to nonvolatile memory devices, and more particularly, to embodiments of a monolithic three-dimensional array of nonvolatile memory cells.

A nonvolatile random access memory device normally comprises an array of memory cells, each of which includes a nonvolatile memory element and a selection element, such as transistor, coupled in series between two electrodes. The selection element functions like a switch to direct current or voltage through the selected memory element coupled thereto. Upon application of an appropriate voltage or current to the selected memory element, the resistance of the memory element would change accordingly, thereby switching the stored logic in the respective memory cell.

FIG. 1 is a schematic circuit diagram of a nonvolatile memory array 20, which comprises a plurality of memory cells 22 with each of the memory cells 22 including an access transistor 24 coupled to a resistance-switching memory element 26; a plurality of parallel word lines 28 with each being coupled to the gates of a respective row of the access transistors 24 in a first direction; a plurality of parallel bit lines 30 with each being coupled to a respective row of the memory elements 26 in a second direction substantially perpendicular to the first direction; and a plurality of parallel source lines 32 with each being coupled to a respective row of the access transistors 24 in the first or second direction.

The resistance-switching memory element 26 may be classified into at least one of several known groups based on their resistance switching mechanism. The memory element of Phase Change Random Access Memory (PCRAM) may comprise a phase change chalcogenide compound, which can switch between a resistive phase (amorphous or crystalline) and a conductive crystalline phase. The memory element of Conductive Bridging Random Access Memory (CBRAM) relies on the statistical bridging of metal rich precipitates therein for its switching mechanism. The memory element of CBRAM normally comprises a nominally insulating metal oxide material, which can switch to a lower electrical resistance state as the metal rich precipitates grow and link to form conductive paths or filaments upon application of an appropriate voltage.

The memory element of Magnetic Random Access Memory (MRAIVI) normally includes a magnetic reference layer and a magnetic free layer with an electron tunnel junction layer interposed therebetween. The magnetic reference layer, the electron tunnel junction layer, and the magnetic free layer collectively form a magnetic tunneling junction (MTJ). Upon the application of an appropriate current or voltage to the MTJ, the magnetization direction of the magnetic free layer can be switched between two directions: parallel and anti-parallel with respect to the magnetization direction of the magnetic reference layer. The electron tunnel junction layer is normally made of an insulating material with a thickness ranging from a few to a few tens of angstroms. When the magnetization directions of the magnetic free and reference layers are substantially parallel or oriented in a same direction, electrons polarized by the magnetic reference layer can tunnel through the insulating tunnel junction layer, thereby decreasing the electrical resistance of the MTJ. Conversely, the electrical resistance of the MTJ is high when the magnetization directions of the magnetic reference and free layers are substantially anti-parallel or oriented in opposite directions. The stored logic in the magnetic memory element can be switched by changing the magnetization direction of the magnetic free layer between parallel and anti-parallel with respect to the magnetization direction of the magnetic reference layer. Therefore, the two stable resistance regimes enable the MTJ to serve as a nonvolatile memory element.

The conventional nonvolatile memory array 20 illustrated in FIG. 1, which uses access transistors 24, is mostly limited to a single layer of memory cells 22. Therefore, there is a need for a nonvolatile memory device that uses a monolithic three-dimensional array architecture to reduce cost by increasing the number of memory layers.

SUMMARY

The present invention is directed to a three-dimensional memory array that satisfies this need. A memory array having features of the present invention includes one or more memory layers with each memory layer comprising a first plurality of memory cells and a second plurality of memory cells arranged in alternated odd and even columns, respectively; a first plurality of odd horizontal lines with each connected to a respective odd column of the first plurality of memory cells at a first end of the respective odd column of the first plurality of memory cells; a second plurality of even horizontal lines with each connected to a respective even column of the second plurality of memory cells at a first end of the respective even column of the second plurality of memory cells; a plurality of transverse lines with each connected to one of the first plurality of memory cells and a respective one of the second plurality of memory cells disposed adjacent thereto at a second end of the one of the first plurality of memory cells and the respective one of the second plurality of memory cells along a row direction; and a plurality of vertical lines with each connected to a respective one of the plurality of transverse lines. The first plurality of odd horizontal lines collectively form fingers of a first comb structure and the second plurality of even horizontal lines collectively form fingers of a second comb structure.

BRIEF DESCRIPTION OF THE DRAWINGS

These and other features, aspects, and advantages of the present invention will become better understood with regard to the following description, appended claims, and accompanying drawings where:

For purposes of clarity and brevity, like elements and components will bear the same designations and numbering throughout the Figures, which are not necessarily drawn to scale.

DETAILED DESCRIPTION

In the Summary above and in the Detailed Description, and the claims below, and in the accompanying drawings, reference is made to particular features of the invention. It is to be understood that the disclosure of the invention in this specification includes all possible combinations of such particular features. For example, where a particular feature is disclosed in the context of a particular aspect or embodiment of the invention, or a particular claim, that feature can also be used, to the extent possible, in combination with and/or in the context of other particular aspects and embodiments of the invention, and in the invention generally.

The term "at least" followed by a number is used herein to denote the start of a range beginning with that number, which may be a range having an upper limit or no upper limit, depending on the variable being defined. For example, "at least 1" means 1 or more than 1. The term "at most" followed by a number is used herein to denote the end of a range ending with that number, which may be a range having 1 or 0 as its lower limit, or a range having no lower limit, depending upon the variable being defined. For example, "at most 4" means 4 or less than 4, and "at most 40%" means 40% or less than 40%. When, in this specification, a range is given as "a first number to a second number" or "a first number-a second number," this means a range whose lower limit is the first number and whose upper limit is the second number. For example, "25 to 100 nm" means a range whose lower limit is 25 nm and whose upper limit is 100 nm.

Where reference is made herein to a material AB composed of element A and element B, the material AB can be an alloy, a compound, or a combination thereof, except where the context excludes that possibility.

Figure 1:
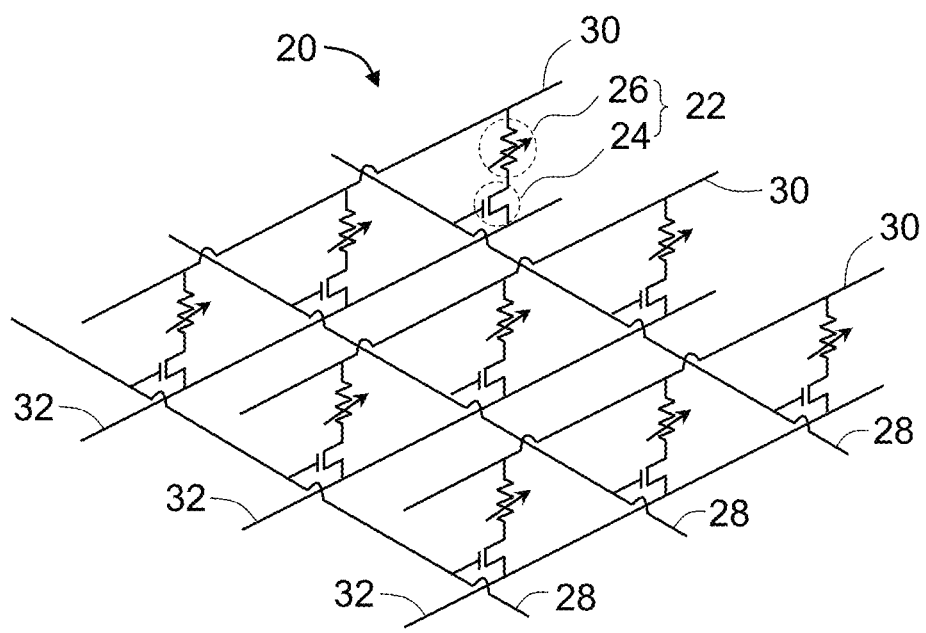
FIG. 1 is a schematic circuit diagram illustrating a conventional array of nonvolatile memory cells, each of which includes a resistance-switching memory element and an access transistor coupled in series between two conductive lines.
Figure 2:
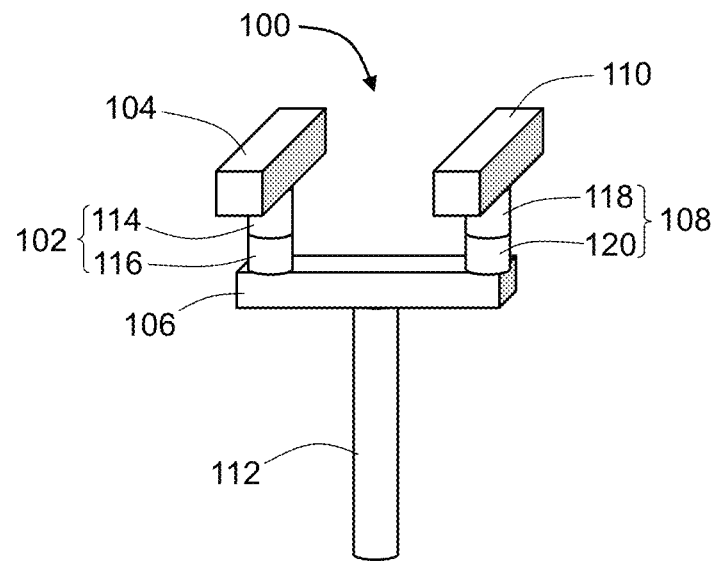
FIG. 2 is a perspective view of an assembly of upper conjugate pair of memory cells in accordance with an embodiment of the present invention.

An embodiment of the present invention as applied to an assembly of an upper conjugate pair of memory cells for a three-dimensional nonvolatile memory architecture will now be described with reference to FIG. 2. Referring now to FIG. 2, the assembly of the upper conjugate pair of memory cells 100 includes an upper odd memory cell 102 connected to an upper odd horizontal line 104 at the top end and a transverse line 106 at the bottom end, an upper even memory cell 108 connected to an upper even horizontal line 110 at the top end and the transverse line 106 at the bottom end, and a vertical line 112 connected to the transverse line 106 and extending in between the upper pair of memory cells 102 and 108 along a direction substantially perpendicular to the substrate surface (not shown) beneath the vertical line 112. The upper odd and even horizontal lines 104 and 110 extend along a first direction that is substantially parallel to the substrate surface. The transverse line 106 may align along a second direction that is substantially perpendicular to the first direction and the vertical line 112. The upper odd memory cell 102 further includes a resistance-switching memory element 114 and a two-terminal selector 116 coupled in series between the upper odd horizontal line 104 and the transverse line 106. Similarly, the upper even memory cell 108 further includes a resistance-switching memory element 118 and a two-terminal selector 120 coupled in series between the upper even horizontal line 110 and the transverse line 106. While FIG. 2 shows the memory elements 114 and 118 formed above the selectors 116 and 120, respectively, the stacking order may be reversed such that the selectors 116 and 120 are formed on top of the memory elements 114 and 118, respectively.

Figure 3:
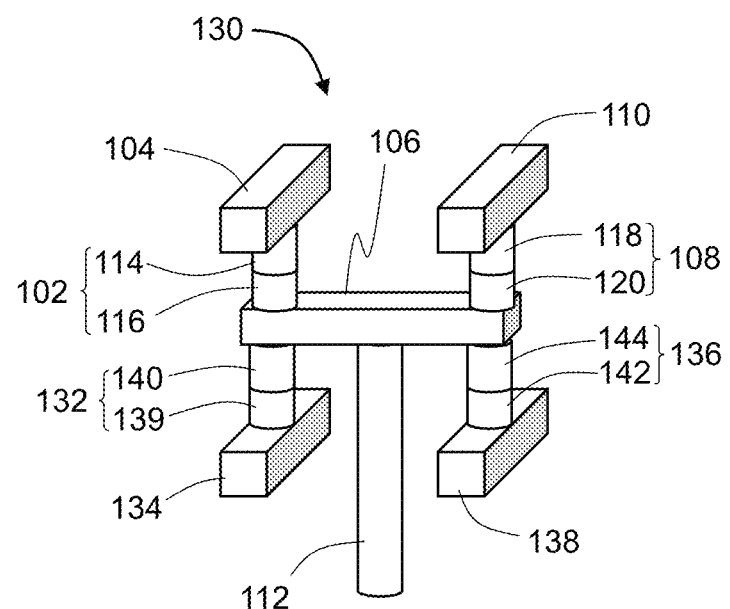
FIG. 3 is a perspective view of an assembly of upper conjugate pair and lower conjugate pair of memory cells in accordance with another embodiment of the present invention.

Another embodiment of the present invention as applied to an assembly of two conjugate pairs of memory cells for a three-dimensional nonvolatile memory architecture will now be described with reference to FIG. 3. In the drawing, numerals 102 to 120 denote the same components as those of the embodiment 100 shown in FIG. 2. The assembly of two conjugate pairs of memory cells 130 includes an upper odd memory cell 102 connected to an upper odd horizontal line 104 at the top end and a transverse line 106 at the bottom end, an upper even memory cell 108 connected to an upper even horizontal line 110 at the top end and the transverse line 106 at the bottom end, a lower odd memory cell 132 connected to a lower odd horizontal line 134 at the bottom end and the transverse line 106 at the top end, a lower even memory cell 136 connected to a lower even horizontal line 138 at the bottom end and the transverse line 106 at the top end, and a vertical line 112 connected to the transverse line 106 and extending in between the odd memory cells 102, 132 and the even memory cells 108, 136 along a direction substantially perpendicular to the substrate surface (not shown) beneath the vertical line 112. The odd and even horizontal lines 104, 110, 134, and 138 extend along a first direction that is substantially parallel to the substrate surface. The transverse line 106 may align along a second direction that is substantially perpendicular to the first direction and the vertical line 112. The upper odd memory cell 102 further includes a resistance-switching memory element 114 and a two-terminal selector 116 coupled in series between the upper odd horizontal line 104 and the transverse line 106. The upper even memory cell 108 further includes a resistance-switching memory element 118 and a two-terminal selector 120 coupled in series between the upper even horizontal line 110 and the transverse line 106. The lower odd memory cell 132 further includes a resistance-switching memory element 139 and a two-terminal selector 140 coupled in series between the lower odd horizontal line 134 and the transverse line 106. The lower even memory cell 136 further includes a resistance-switching memory element 142 and a two-terminal selector 144 coupled in series between the lower even horizontal line 138 and the transverse line 106. While FIG. 3 shows the upper memory cells 102, 108 and the lower memory cells 132, 136 have opposite memory element/selector stacking orders, a same stacking order may be used for the upper memory cells 102, 108 and the lower memory cells 132, 136. For example, all memory cells 102, 108, 132, and 136 may the memory element formed above the selector or vice versa.

Still another embodiment of the present invention as applied to an assembly of a conjugate pair of memory cells for a three-dimensional nonvolatile memory architecture will now be described with reference to FIG. 4. In the drawing, numerals 106, 112, and 132 to 144 denote the same components as those of the embodiment 130 shown in FIG. 3. The assembly of the lower conjugate pair of memory cells 150 includes a lower odd memory cell 132 connected to a lower odd horizontal line 134 at the bottom end and a transverse line 106 at the top end, a lower even memory cell 136 connected to a lower even horizontal line 138 at the bottom end and the transverse line 106 at the top end, and a vertical line 112 connected to the transverse line 106 and extending in between the lower odd memory cell 132 and the lower even memory cell 136 along a direction substantially perpendicular to the substrate surface (not shown) beneath the vertical line 112. The lower odd and even horizontal lines 134 and 138 extend along a first direction that is substantially parallel to the substrate surface. The transverse line 106 may align along a second direction that is substantially perpendicular to the first direction and the vertical line 112. The lower odd memory cell 132 further includes a resistance-switching memory element 139 and a two-terminal selector 140 coupled in series between the lower odd horizontal line 134 and the transverse line 106. The lower even memory cell 136 further includes a resistance-switching memory element 142 and a two-terminal selector 144 coupled in series between the lower even horizontal line 138 and the transverse line 106. While FIG. 4 shows the memory elements 138 and 142 formed beneath the selectors 140 and 144, respectively, the stacking order of may be reversed such that the memory elements 139 and 142 are formed on top of the selectors 140 and 144, respectively.

Figure 4:
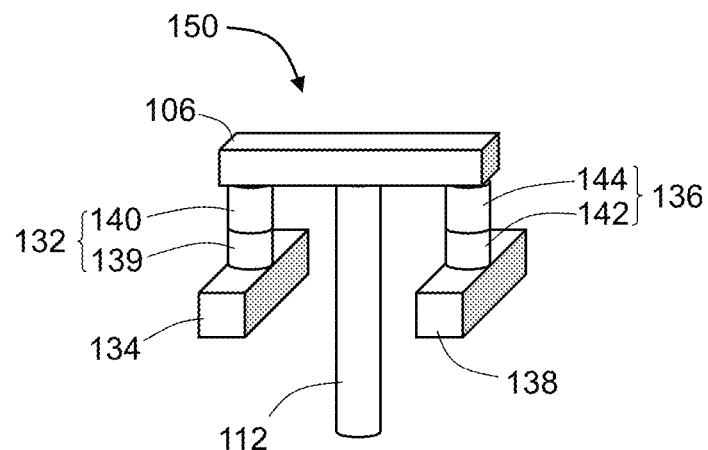
FIG. 4 is a perspective view of an assembly of lower conjugate pair of memory cells in accordance with still another embodiment of the present invention.
Figure 5:
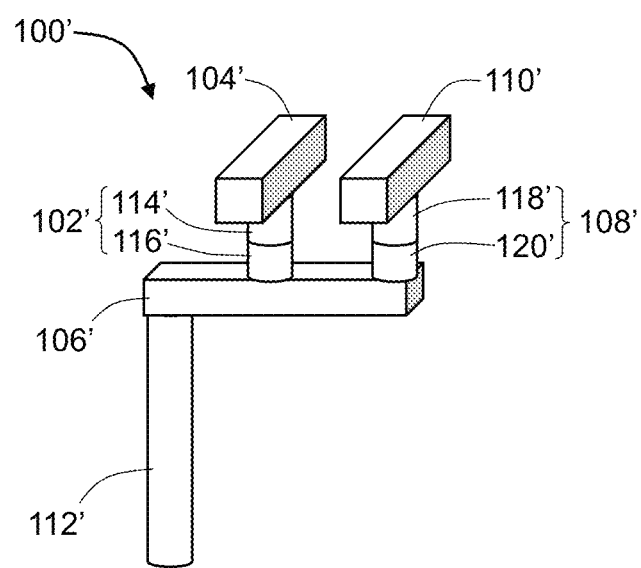
FIG. 5 is a perspective view of an assembly of upper conjugate pair of memory cells in accordance with yet another embodiment of the present invention.
Figure 6:
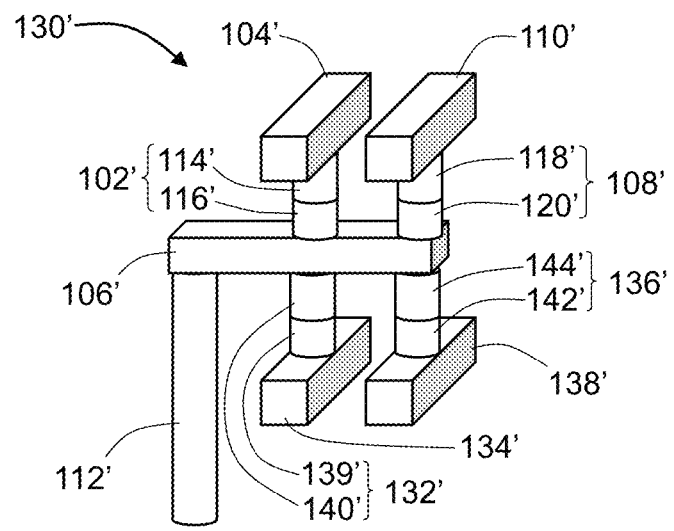
FIG. 6 is a perspective view of an assembly of upper conjugate pair and lower conjugate pair of memory cells in accordance with still yet another embodiment of the present invention.
Figure 7:
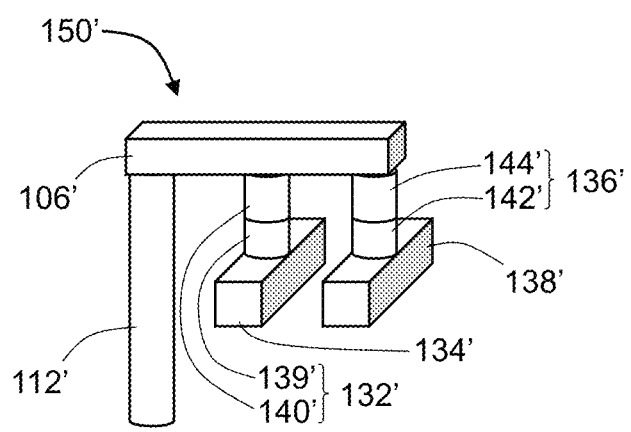
FIG. 7 is a perspective view of an assembly of lower conjugate pair of memory cells in accordance with yet still another embodiment of the present invention.

In the embodiments of FIGS. 2-4, the vertical line 112 passes in between the odd memory cells 102, 132 and the even memory cells 108, 136. FIGS. 5-7 show an alternative arrangement in which the vertical line 112' does not pass in between the odd memory cells 102', 132' and the even memory cells 108', 136'. FIG. 5 shows an assembly of an upper conjugate pair of memory cells 100' that includes an upper odd memory cell 102' connected to an upper odd horizontal line 104' at the top end and a transverse line 106' at the bottom end, an upper even memory cell 108' connected to an upper even horizontal line 110' at the top end and the transverse line 106' at the bottom end, and a vertical line 112' connected to the transverse line 106' at or near one end of the transverse line 106' and extending along a direction substantially perpendicular to the substrate surface (not shown) beneath the vertical line 112'. The upper odd and even horizontal lines 104' and 110' extend along a first direction that is substantially parallel to the substrate surface. The transverse line 106' may align along a second direction that is substantially perpendicular to the first direction and the vertical line 112'. The upper odd memory cell 102' further includes a resistance-switching memory element 114' and a two-terminal selector 116' coupled in series between the upper odd horizontal line 104' and the transverse line 106'. Similarly, the upper even memory cell 108' further includes a resistance-switching memory element 118' and a two-terminal selector 120' coupled in series between the upper even horizontal line 110' and the transverse line 106'. While FIG. 5 shows the memory elements 114' and 118' formed above the selectors 116' and 120', respectively, the stacking order may be reversed such that the selectors 116' and 120' are formed on top of the memory elements 114' and 118', respectively.

FIG. 6 shows the assembly of two conjugate pairs of memory cells 130' that includes an upper odd memory cell 102' connected to an upper odd horizontal line 104' at the top end and a transverse line 106' at the bottom end, an upper even memory cell 108' connected to an upper even horizontal line 110' at the top end and the transverse line 106' at the bottom end, a lower odd memory cell 132' connected to a lower odd horizontal line 134' at the bottom end and the transverse line 106' at the top end, a lower even memory cell 136' connected to a lower even horizontal line 138' at the bottom end and the transverse line 106' at the top end, and a vertical line 112' connected to the transverse line 106' at or near one end of the transverse line 106' and extending along a direction substantially perpendicular to the substrate surface (not shown) beneath the vertical line 112'. The odd and even horizontal lines 104', 110', 134', and 138' extend along a first direction that is substantially parallel to the substrate surface. The transverse line 106' may align along a second direction that is substantially perpendicular to the first direction and the vertical line 112'. The upper odd memory cell 102' further includes a resistance-switching memory element 114' and a two-terminal selector 116' coupled in series between the upper odd horizontal line 104' and the transverse line 106'. The upper even memory cell 108' further includes a resistance-switching memory element 118' and a two-terminal selector 120' coupled in series between the upper even horizontal line 110' and the transverse line 106'. The lower odd memory cell 132' further includes a resistance-switching memory element 139' and a two-terminal selector 140' coupled in series between the lower odd horizontal line 134' and the transverse line 106'. The lower even memory cell 136' further includes a resistance-switching memory element 142' and a two-terminal selector 144' coupled in series between the lower even horizontal line 138' and the transverse line 106'. While FIG. 6 shows the upper memory cells 102', 108' and the lower memory cells 132', 136' have opposite memory element/selector stacking orders, a same stacking order may be used for the upper memory cells 102', 108' and the lower memory cells 132', 136'.

FIG. 7 illustrates an assembly of the lower conjugate pair of memory cells 150' that includes a lower odd memory cell 132' connected to a lower odd horizontal line 134' at the bottom end and a transverse line 106' at the top end, a lower even memory cell 136' connected to a lower even horizontal line 138' at the bottom end and the transverse line 106' at the top end, and a vertical line 112' connected to the transverse line 106' at or near one end of the transverse line 106' and extending along a direction substantially perpendicular to the substrate surface (not shown) beneath the vertical line 112'. The lower odd and even horizontal lines 134' and 138' extend along a first direction that is substantially parallel to the substrate surface. The transverse line 106' may align along a second direction that is substantially perpendicular to the first direction and the vertical line 112'. The lower odd memory cell 132' further includes a resistance-switching memory element 139' and a two-terminal selector 140' coupled in series between the lower odd horizontal line 134' and the transverse line 106'. The lower even memory cell 136' further includes a resistance-switching memory element 142' and a two-terminal selector 144' coupled in series between the lower even horizontal line 138' and the transverse line 106'. While FIG. 7 shows the memory elements 139' and 142' formed beneath the selectors 140' and 144', respectively, the stacking order of may be reversed such that the memory elements 139' and 142' are formed on top of the selectors 140' and 144', respectively.

The resistance-switching memory elements 114, 118, 139, 142, 114', 118', 139', and 142' may switch their resistance state by any suitable switching mechanism, such as but not limited to phase change, precipitate bridging, magnetoresistive switching, or any combination thereof. In one embodiment, the memory elements 114, 118, 139, 142, 114', 118', 139', and 142' comprise a phase change chalcogenide compound, such as but not limited to $Ge_2Sb_2Te_5$ or AgInSbTe, which can switch between a resistive phase and a conductive phase. In another embodiment, the memory elements 114, 118, 139, 142, 114', 118', 139', and 142' comprise a nominally insulating metal oxide material, such as but not limited to NiO, $TiO_2$, or $Sr(Zr)TiO_3$, which can switch to a lower electrical resistance state as the metal rich precipitates grow and link to form conductive paths upon application of an appropriate voltage. In still another embodiment, the memory elements 114, 118, 139, 142, 114', 118', 139', and 142' comprise an MTJ that includes a magnetic free layer and a magnetic reference layer with an insulating electron tunnel junction layer interposed therebetween. The magnetic free and reference layers may have magnetization directions that are substantially perpendicular to the layer planes thereof.

Figure 8:
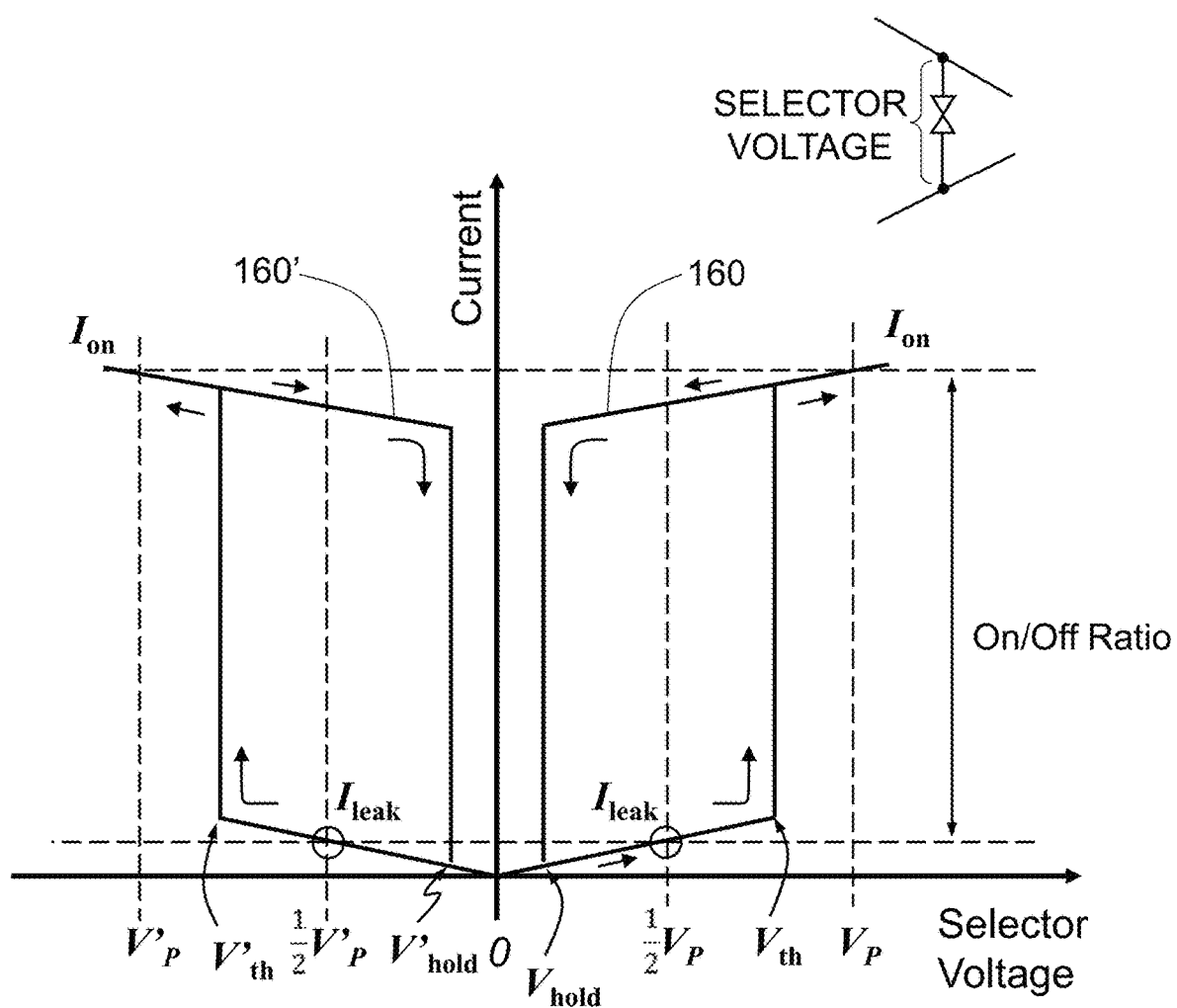
FIG. 8 is an exemplary I-V response plot for a two-terminal selector that functions as a bidirectional threshold switch.

The two-terminal selectors 116, 120, 140, 144, 116', 120', 140', and 144' may include two electrodes with a volatile switching layer interposed therebetween as described in U.S. Pat. No. 10,224,367, the content of which is incorporated herein by reference in its entirety. The two-terminal selectors 116, 120, 140, 144, 116', 120', 140', and 144' may function as a bidirectional threshold switch having an exemplary current-voltage (I-V) response plot as illustrated in FIG. 8. The I-V response curve 160 shows the magnitude of electric current passing through the selector as the voltage applied thereto varies. Initially, the current slightly increases with the applied voltage from zero to near a threshold voltage, $V_{th}$. At or near $V_{th}$, the current rapidly increases and exhibits a highly non-linear exponential behavior, indicating a transition of the selector from a nominally insulative or "off" state to a nominally conductive or "on" state. As the selector voltage continues to increase beyond $V_{th}$, the current increase becomes gradual until reaching $V_P$, which may be the programming voltage required to drive a switching current through a memory element coupled to the selector. The current response behaves like a highly non-linear step function as the applied voltage increases from zero to $V_P$ with the sharp increase occurring at or near $V_{th}$, which may be about 60-80% of $V_P$. The leakage current, $I_{leak}$, for the selector in the "off" state may be measured at the selector voltage of $V_P/2$. The ratio of $I_{on}$, which is the selector current at $V_P$, to $I_{leak}$ measured at $V_P/2$ is sometimes referred to as "on/off ratio."

With continuing reference to FIG. 8, as the selector voltage decreases from $V_P$ to near a holding voltage, $V_{hold}$, which is lower than $V_{th}$, the selector current gradually decreases and the selector remains in the conductive state. At or near $V_{hold}$, the current rapidly decreases and exhibits a highly non-linear behavior, indicating a transition from the nominally conductive state back to the nominally insulative state. As the voltage continues to decrease beyond $V_{hold}$, the current flow slightly decreases until stopping at about 0 V.

The I-V response curve 160 of the selector behaves like a hysteresis loop. The nominally insulating selector turns on or becomes conductive when the selector voltage exceeds $V_{th}$. Once in the conductive state, the selector will stay on or remain conductive until the selector voltage dropping below $V_{hold}$, which is less than $V_{th}$. In a conventional write or programming operation, the selector is first turned on by raising the selector voltage to about $V_{th}$. The selector voltage is then further increased to a higher level $V_P$ that is sufficient to drive a current $I_{on}$ for switching the resistance state of the memory element coupled thereto. In a conventional read or sensing operation, the selector is first turned on by raising the selector voltage to about $V_{th}$. The selector voltage may then be decreased to a level between $V_{th}$ and $V_{hold}$ to minimize "read disturbance" while ensuring that the selector is sufficiently conductive to allow a sensing current to pass therethrough for determining the resistance state of the memory element.

The I-V response plot of FIG. 8 is bidirectional as the polarity of the selector voltage may be reversed from zero to $V'_P$ as shown. The I-V response curve 160' corresponding to the opposite polarity may be substantially similar to the curve 160 described above.

Figure 9:
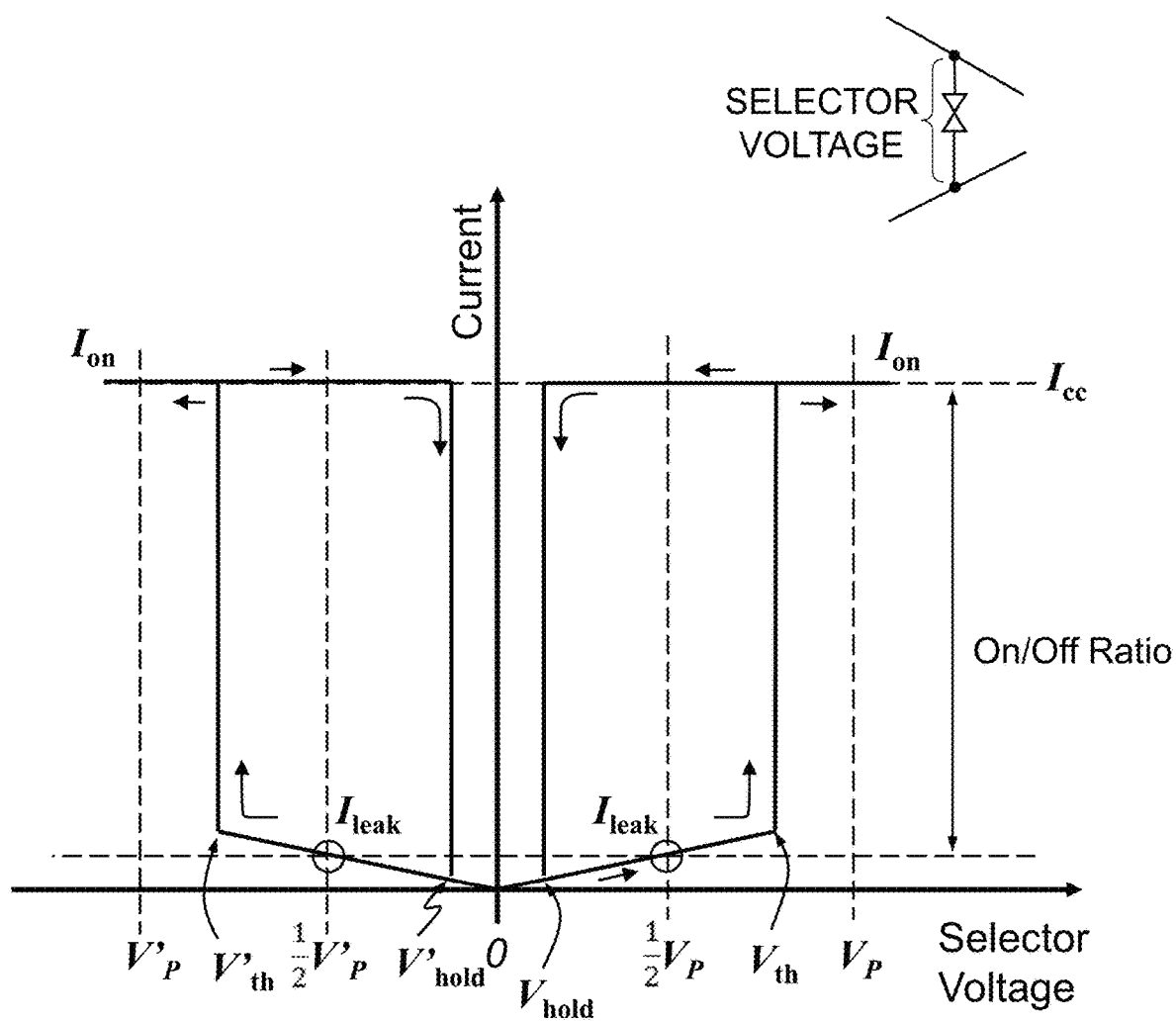
FIG. 9 is another exemplary I-V response plot for a two-terminal selector.
Figure 10:
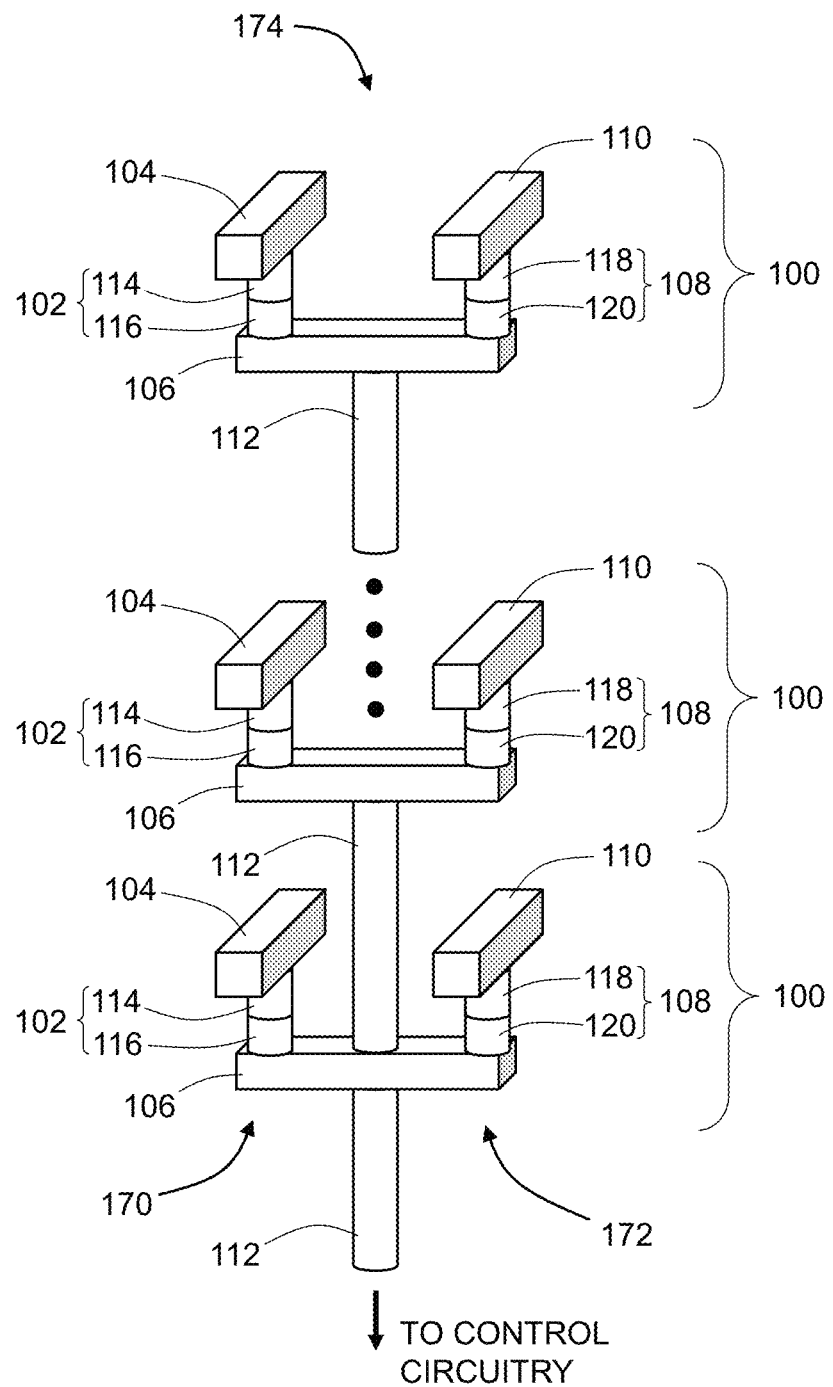
FIG. 10 is a perspective view of a vertical block of memory cells formed by stacking multiple upper conjugate pairs of memory cells shown in FIG. 2.
Figure 11:
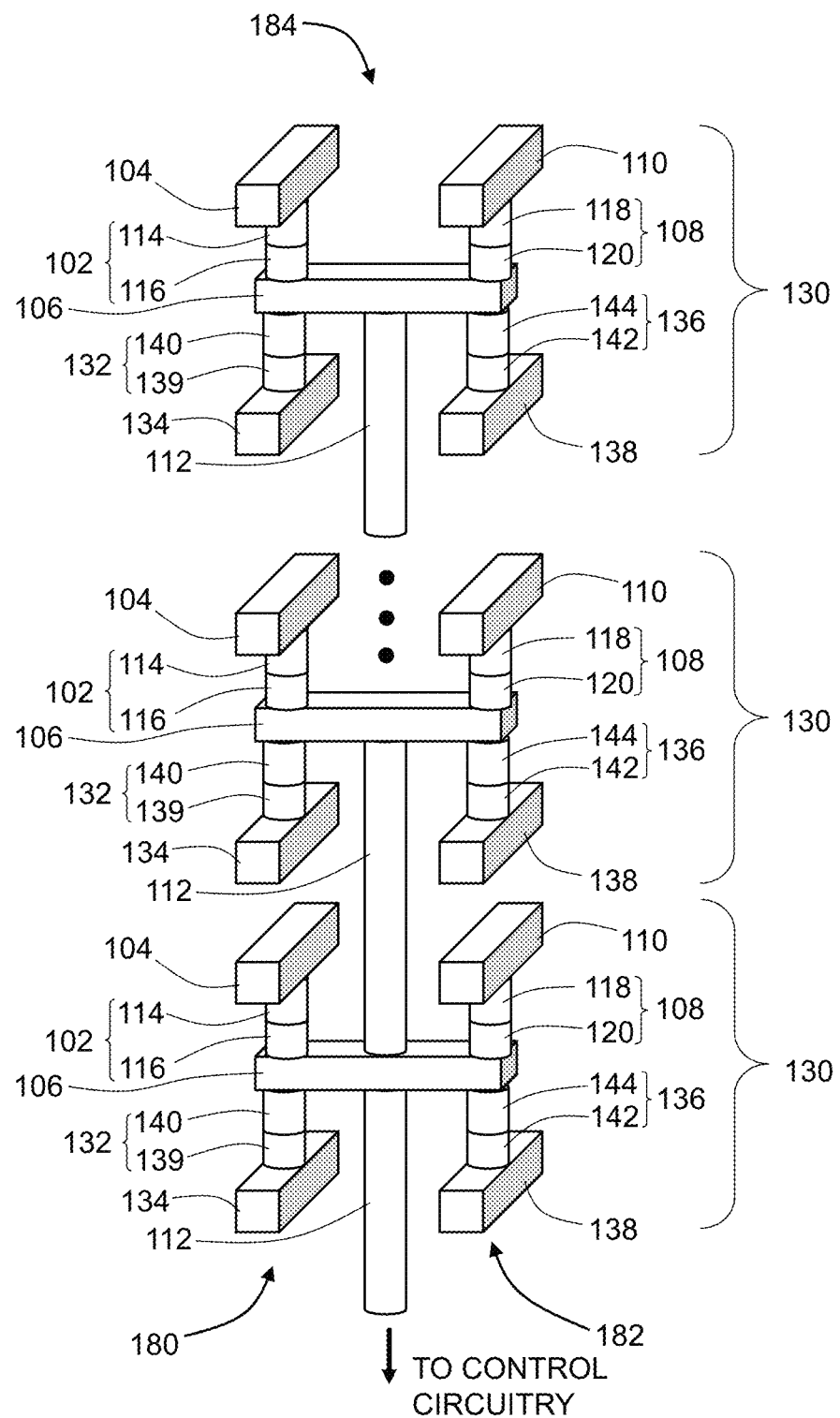
FIG. 11 is a perspective view of a vertical block of memory cells formed by stacking multiple upper conjugate pairs and lower conjugate pairs of memory cells shown in FIG. 3.

The two-terminal selectors 116, 120, 140, 144, 116', 120', 140', and 144' may alternatively have an I-V response shown in FIG. 9. The I-V response plot of FIG. 9 differs from the I-V response plot of FIG. 8 in that after the selector is turned on at $V_{th}$, the current remains substantially constant with continuously increasing selector voltage or decreasing selector voltage until reaching $V_{hold}$, below which the selector is turned off. The constant current is sometimes referred to as "compliance current" ($I_{cc}$).

The vertical lines 112, 112' and the transverse lines 106, 106' and the horizontal lines 104, 110, 134, 138, 104', 110', 134', 138' each may be made of any suitable conductor, such as but not limited to copper (Cu), tungsten (W), aluminum (Al), silver (Ag), gold (Au), titanium (Ti), ruthenium (Ru), iridium (Ir), platinum (Pt), palladium (Pd), tantalum (Ta), titanium nitride ($TiN_x$), tantalum nitride ($TaN_x$), or any combination thereof.

Multiple units of the upper conjugate pair of memory cells 100 illustrated in FIG. 2 may be stacked one on top of another to form an odd vertical string of memory cells 170 and an even vertical string of memory cells 172, which collectively form a vertical block of memory cells 174. The odd vertical string of memory cells 170 includes multiple upper odd memory cells 102, each of which is interposed between the transverse line 106 and the upper odd horizontal line 104. The even vertical string of memory cells 172 includes multiple upper even memory cells 108, each of which is interposed between the transverse line 106 and the upper even horizontal line 110.

Similarly, multiple units of the two conjugate pairs of memory cells 130 illustrated in FIG. 3 may be stacked one on top of another to form an odd vertical string of memory cells 180 and an even vertical string of memory cells 182, which collectively form a vertical block of memory cells 184. The odd vertical string of memory cells 180 includes multiple upper odd memory cells 102 and lower odd memory cells 132, while the even vertical string of memory cells 182 includes multiple upper even memory cells 108 and lower even memory cells 136. Other embodiments of conjugate pairs of memory cells 150, 100', 130', and 150', as shown in FIGS. 4-7, respectively, may be similarly stacked to form vertical blocks of memory cells (not shown).

Figure 12:
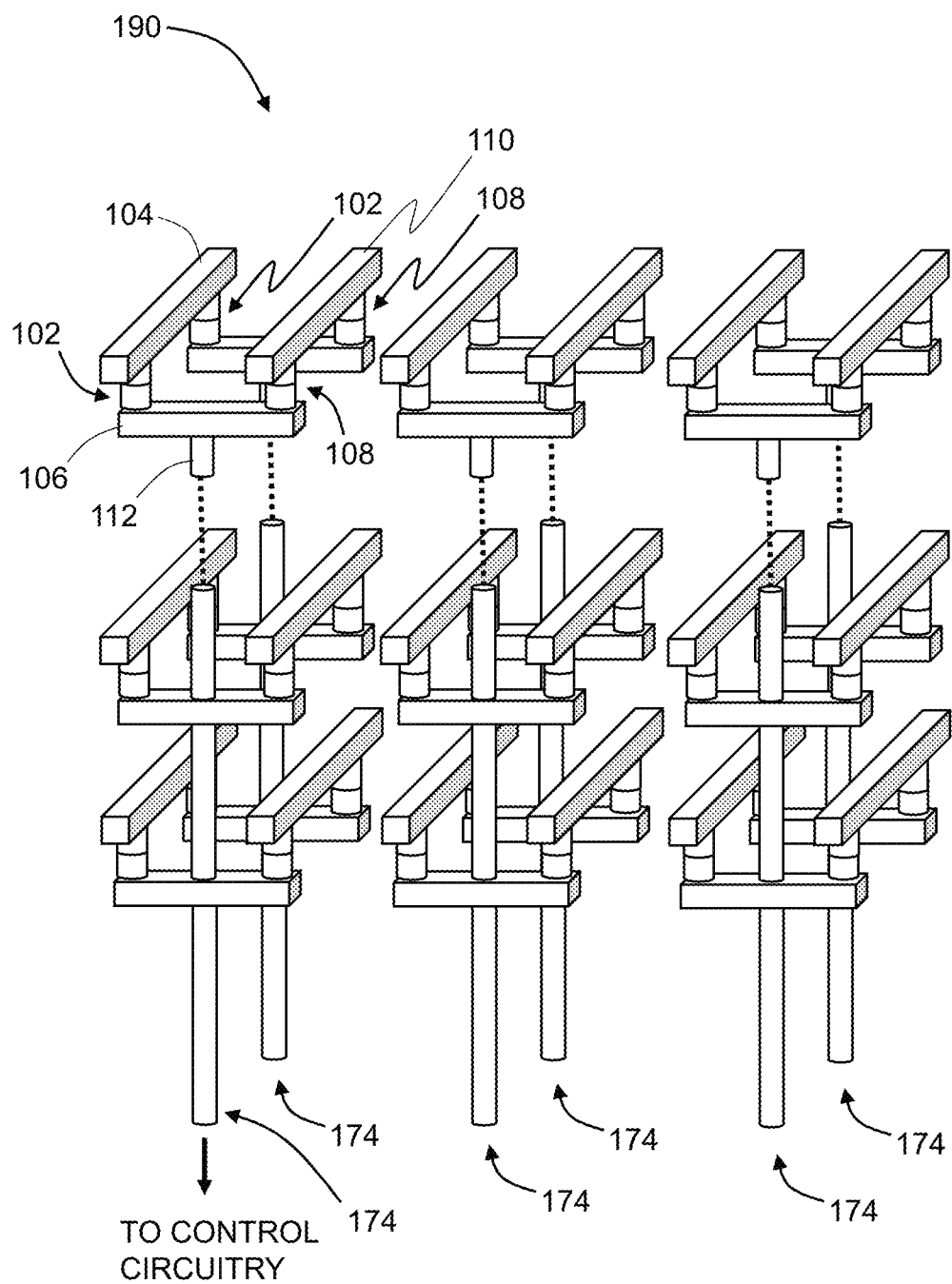
FIG. 12 is a perspective view of a monolithic three-dimensional array of memory cells formed by arranging multiple vertical blocks of memory cells shown in FIG. 11 into rows and columns.

An embodiment of the present invention as applied to the assembly of the upper conjugate pair of memory cells 100 and the corresponding vertical block of memory cells 174 for forming a monolithic three-dimensional array of memory cells is shown in FIG. 12. A plurality of the vertical blocks of memory cells 174 may be arranged in rows and columns to form a three-dimensional array of memory cells 190. Each memory layer of the three-dimensional array of memory cells 190 includes a first plurality of upper odd memory cells 102 and a second plurality of upper even memory cells 108 arranged in alternated odd and even columns, respectively; a first plurality of upper odd horizontal lines 104, which extend along the first direction parallel to the odd column direction, with each connected to a respective odd column of the upper odd memory cells 102 at a first end of the respective odd column of the upper odd memory cells 102; a second plurality of upper even horizontal lines 110, which extend along the first direction parallel to the even column direction, with each connected to a respective even column of the upper even memory cells 108 at a first end of the respective even column of the upper even memory cells 108; a plurality of transverse lines 106 oriented in a row direction with each connected to one of the first plurality of upper odd memory cells 102 and a respective one of the second plurality of upper even memory cells 108 disposed adjacent thereto along the row direction at a second end; and a plurality of vertical lines 112, which extend along the vertical direction, with each connected to a respective one of the plurality of transverse lines 106 and other memory layers. Each one of the plurality of vertical lines 112 may be connected to multiple transverse lines 106 in other memory layers. While FIG. 12 shows each memory layer having six columns and two rows of memory cells, the present invention may be practiced with any number of columns or rows of memory cells to form a three-dimensional array. In an embodiment, the number of the upper odd memory cells 102 is same as the number of the upper even memory cells 108. In an alternative embodiment, the number of the upper odd memory cells 102 is different from the number of the upper even memory cells 108.

Other embodiments of the three-dimensional array of memory cells (not shown) may be similarly constructed using other assemblies of conjugate pairs of memory cells 130, 150, 100', 130', and 150'. For embodiments that are constructed from the assemblies of conjugate pairs of memory cells 100, 130, and 150, the vertical line 112 passes in between the conjugate pair of memory cells 102/108 or 132/136 that are coupled to a same transverse line 106. For embodiments that include the upper memory cells 102, 102', 108, and 108', the first end and the second end of the upper memory cells 102, 102', 108, and 108' may correspond to the top end and the bottom end thereof, respectively. For embodiments that include the lower memory cells 132, 132', 136, and 136', the first end and the second end of the lower memory cells 132, 132', 136, and 136' may correspond to the bottom end and the top end thereof, respectively.

Figure 13A:
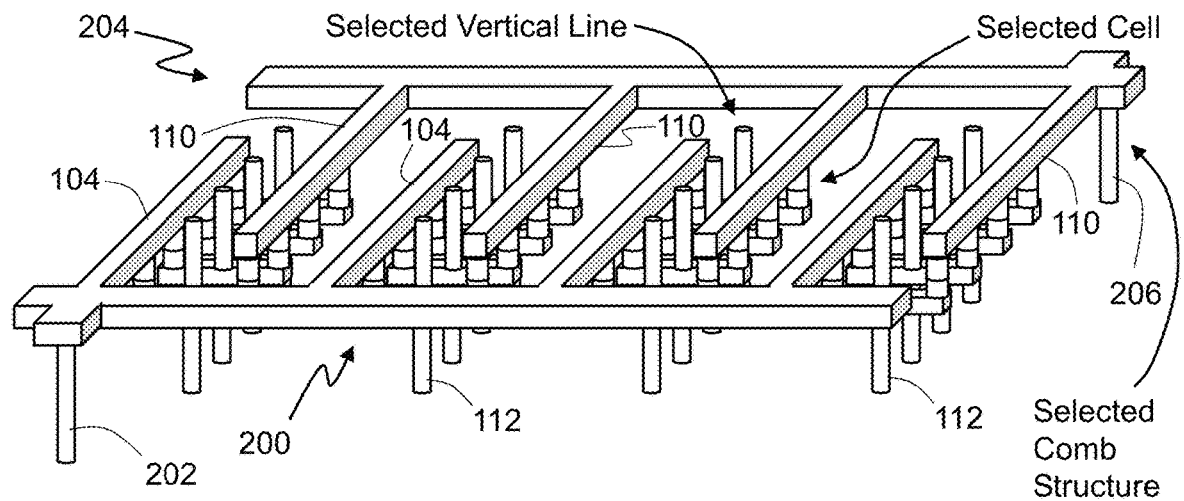
FIGS. 13A and 13B are a perspective view and corresponding top view of an exemplary memory layer of a three-dimensional array of memory cells showing the connection scheme for the horizontal lines in accordance with an embodiment of the present invention.
Figure 13B:
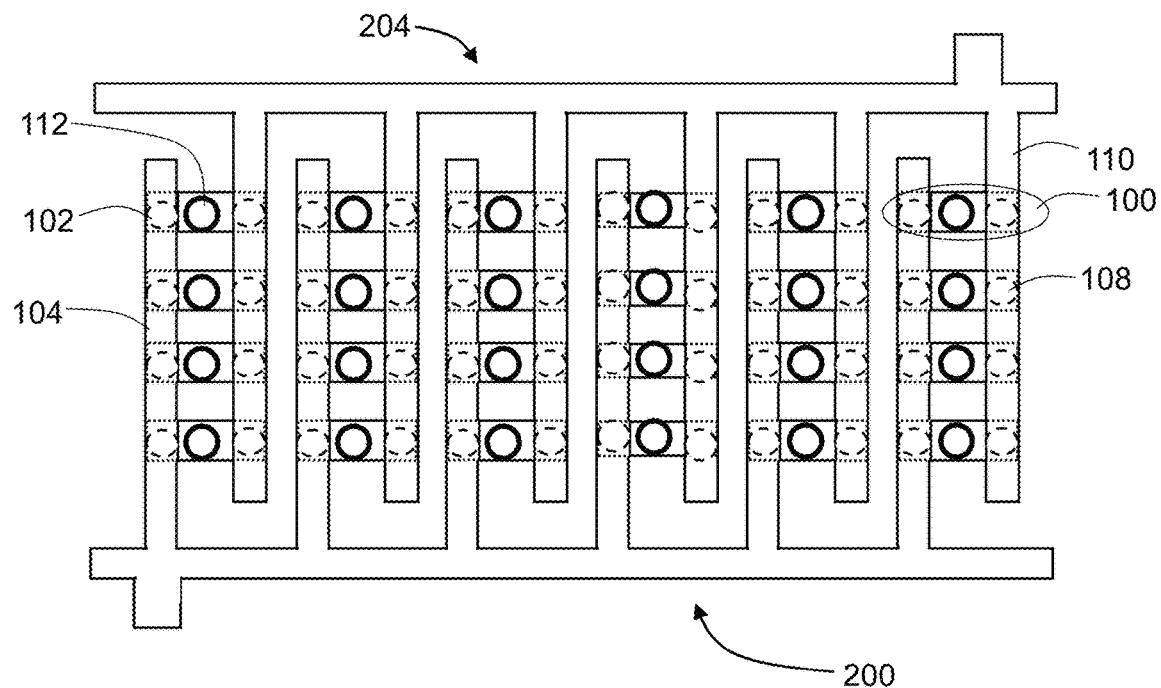

FIGS. 13A and 13B are a perspective view and corresponding top view of an exemplary memory layer of a three-dimensional array of memory cells showing the connection scheme for the horizontal lines in accordance with an embodiment of the present invention. The memory layer is shown to have four columns of upper odd memory cells and four column of upper even memory cells with each column having four rows, the present invention may be practiced with any suitable number of columns or rows of memory cells to form a memory layer. Referring now to FIG. 13A, all odd horizontal lines 104 in the memory layer are electrically connected and form the fingers of an odd comb structure 200, which is electrically connected to the control circuitry below (not shown) through an odd via 202. Similarly, all even horizontal lines 110 in the memory layer are electrically connected and form the fingers of an even comb structure 204, which is connected to the control circuitry below (not shown) through an even via 206. Any memory cell in the memory layer may be independently selected for read or write operation by grounding or applying a voltage to the respective vertical line connected thereto and by grounding or applying a voltage to either the odd comb structure 200 or the even comb structure 204. For example, a selected memory cell shown in FIG. 13A may be activated for read or write operation by applying a voltage, V, to the selected vertical line connected thereto and by grounding the selected comb structure connected to the selected memory cell. In an embodiment, the vertical lines 112 and the horizontal lines 104, 110 function as word lines and bit lines, respectively. In other embodiments, the vertical lines 112 and the horizontal lines 104, 110 function as bit lines and word lines, respectively. The odd/even comb design of the present invention may be similarly applied to three-dimensional memory arrays formed from other assemblies of conjugate pairs of memory cells 130, 150, 100', 130', and 150'. Unlike the conventional three-dimensional array wherein each horizontal line in the memory layer needs to be independently controlled, the present invention combines the comb design for the horizontal lines and the stacking of conjugate pairs of memory cells in the vertical direction to minimize the control circuitry, thereby decreasing the peripheral area on a chip.

Figure 14:
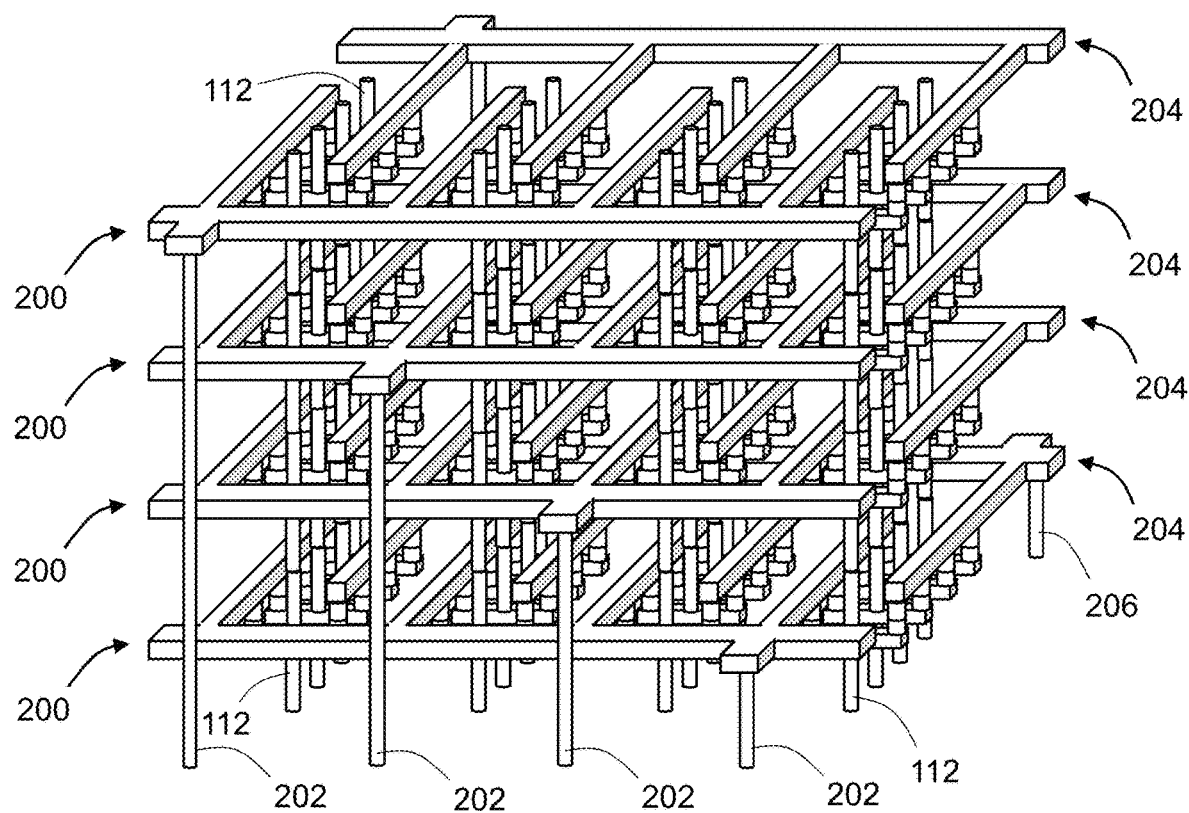
FIG. 14 is a perspective view of an exemplary three-dimensional array of memory cells showing the odd and even comb structures for each memory layer.

FIG. 14 is a perspective view of an exemplary three-dimensional array of memory cells formed by stacking multiple memory layers of FIGS. 13A and 13B. The odd vias 202 for connecting the odd comb structures 200 to the control circuitry below (not shown) may be disposed with an offset in the second direction (i.e., row direction), which is parallel to the transverse lines 106. Similarly, the even vias 206 for connecting the even comb structures 204 to the control circuitry below (not shown) may be disposed with an offset in the second direction. While FIG. 14 shows four memory layers being stacked to form the three-dimensional array of memory cells, the present invention may be practiced with any number of memory layers, including just single memory layer.

While the present invention has been shown and described with reference to certain preferred embodiments, it is to be understood that those skilled in the art will no doubt devise certain alterations and modifications thereto which nevertheless include the true spirit and scope of the present invention. Thus the scope of the invention should be determined by the appended claims and their legal equivalents, rather than by examples given.

What is claimed is:

1. A memory array including one or more memory layers, each memory layer comprising:
   a first plurality of memory cells and a second plurality of memory cells arranged in alternated odd and even columns, respectively;
   a first plurality of odd horizontal lines with each connected to a respective odd column of the first plurality of memory cells at a first end of the respective odd column of the first plurality of memory cells;

a second plurality of even horizontal lines with each connected to a respective even column of the second plurality of memory cells at a first end of the respective even column of the second plurality of memory cells;
a plurality of transverse lines with each connected to one of the first plurality of memory cells and a respective one of the second plurality of memory cells disposed adjacent to the one of the first plurality of memory cells at a second end of the first and second plurality of memory cells along a row direction; and
a plurality of vertical lines with each connected to a respective one of the plurality of transverse lines,
wherein the first plurality of odd horizontal lines collectively form fingers of a first comb structure and the second plurality of even horizontal lines collectively form fingers of a second comb structure.

2. The memory array of claim 1, wherein the second end of the first and second plurality of memory cells corresponds to a bottom end.

3. The memory array of claim 1, wherein the second end of the first and second plurality of memory cells corresponds to a top end.

4. The memory array of claim 1, wherein each memory cell of the first and second plurality of memory cells includes a resistance-switching memory element and a two-terminal selector coupled in series.

5. The memory array of claim 4, wherein the resistance-switching memory element includes a magnetic free layer, a magnetic reference layer, and an insulating tunnel junction layer interposed between the magnetic free and reference layers.

6. The memory array of claim 4, wherein the resistance-switching memory element includes a magnetic tunnel junction (MTJ).

7. The memory array of claim 4, wherein the resistance-switching memory element includes a phase-change material.

8. The memory array of claim 4, wherein the two-terminal selector is a bidirectional threshold switch.

9. The memory array of claim 4, wherein the two-terminal selector includes two electrodes and a volatile switching layer interposed between the two electrodes.

10. The memory array of claim 1, wherein each of the first and second comb structures is connected to a control circuitry below the first and second comb structures.

11. The memory array of claim 1, wherein each of the plurality of vertical lines passes in between one of the first plurality of memory cells and a respective one of the second plurality of memory cells that are connected to a respective one of the plurality of transverse lines.

12. The memory array of claim 1 further comprising:
a third plurality of memory cells and a fourth plurality of memory cells arranged in alternated odd and even columns, respectively;
a third plurality of odd horizontal lines with each connected to a respective odd column of the third plurality of memory cells at a second end of the respective odd column of the third plurality of memory cells;
a fourth plurality of even horizontal lines with each connected to a respective even column of the fourth plurality of memory cells at a second end of the respective even column of the fourth plurality of memory cells,
wherein each of the plurality of the transverse lines is connected to one of the third plurality of memory cells and a respective one of the fourth plurality of memory cells disposed adjacent to the one of the third plurality of memory cells at a first end of the third and fourth plurality of memory cells along the row direction.

13. The memory array of claim 12, wherein the second end of the first, second, third, and fourth plurality of memory cells corresponds to a bottom end.

14. The memory array of claim 12, wherein each memory cell of the first and second plurality of memory cells includes a resistance-switching memory element and a two-terminal selector coupled in series.

15. The memory array of claim 14, wherein the resistance-switching memory element includes a magnetic free layer, a magnetic reference layer, and an insulating tunnel junction layer interposed between the magnetic free and reference layers.

16. The memory array of claim 14, wherein the resistance-switching memory element includes a magnetic tunnel junction (MTJ).

17. The memory array of claim 14, wherein the resistance-switching memory element includes a phase-change material.

18. The memory array of claim 14, wherein the two-terminal selector is a bidirectional threshold switch.

19. The memory array of claim 14, wherein the two-terminal selector includes two electrodes and a volatile switching layer interposed between the two electrodes.

20. The memory array of claim 12, wherein each of the plurality of vertical lines passes in between one of the first plurality of memory cells and a respective one of the second plurality of memory cells that are connected to a respective one of the plurality of transverse lines.

* * * * *